United States Patent
Saruban et al.

(10) Patent No.: US 8,547,683 B2
(45) Date of Patent: Oct. 1, 2013

(54) LAMINATED CERAMIC ELECTRONIC COMPONENT WITH DIRECTLY PLATED EXTERNAL TERMINAL ELECTRODES AND MANUFACTURING METHOD THEREFOR

(75) Inventors: Masahito Saruban, Fukui (JP); Makoto Ogawa, Fukui (JP); Toshiyuki Iwanaga, Sabae (JP); Seiichi Matsumoto, Moriyama (JP); Akihiro Motoki, Fukui (JP); Shunsuke Takeuchi, Echizen (JP); Seiichi Nishihara, Kameoka (JP); Kenichi Kawasaki, Echizen (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 442 days.

(21) Appl. No.: 12/821,305

(22) Filed: Jun. 23, 2010

(65) Prior Publication Data
US 2010/0328843 A1    Dec. 30, 2010

(30) Foreign Application Priority Data
Jun. 30, 2009    (JP) .................................. 2009-154636

(51) Int. Cl.
*H01G 4/228*    (2006.01)
*H01G 4/06*    (2006.01)
*H01G 7/00*    (2006.01)

(52) U.S. Cl.
USPC ...................... 361/306.3; 361/321.2; 29/25.42

(58) Field of Classification Search
USPC ................. 361/306.3, 321.2, 306.1; 29/25.42
See application file for complete search history.

(56) References Cited

U.S. PATENT DOCUMENTS
4,150,178 A * 4/1979 Yagi et al. ..................... 148/531
(Continued)

FOREIGN PATENT DOCUMENTS
| JP | 63-169014 A | | 7/1988 |
| JP | 07090675 A | * | 4/1995 |
| JP | 2000331866 A | * | 11/2000 |
| WO | 2008/059666 A1 | | 5/2008 |

OTHER PUBLICATIONS

Motoki et al.; "Multilayer Electronic Component and Method for Manufacturing the Same"; U.S. Appl. No. 12/110,484, filed Apr. 28, 2008.

(Continued)

*Primary Examiner* — David M Sinclair
(74) *Attorney, Agent, or Firm* — Keating & Bennett, LLP

(57) ABSTRACT

In a method for manufacturing a laminated ceramic electronic component, after a plating layer for an external terminal electrode is formed by applying copper plating to an end surface of a component main body at which respective ends of a plurality of internal electrodes primarily including nickel are exposed, when a heat treatment at a temperature of about 800° C. or more is applied in order to improve adhesion strength and resistance to moisture of the external terminal electrode, voids may occur in the plating layer. The step of applying a heat treatment at a temperature of about 800° C. or more to a component main body with plating layers formed thereon includes not only a step of maintaining a top temperature of about 1000° C. or more but also a step of maintaining a temperature of about 600° C. to 900° C. at least once before the step of maintaining the top temperature.

2 Claims, 4 Drawing Sheets

(56) References Cited

U.S. PATENT DOCUMENTS

| | | | | |
|---|---|---|---|---|
| 4,228,203 A * | 10/1980 | Yagi et al. | | 148/512 |
| 4,748,086 A * | 5/1988 | Akoh | | 428/433 |
| 4,795,658 A * | 1/1989 | Kano et al. | | 216/13 |
| 6,355,147 B1 * | 3/2002 | Griffiths et al. | | 204/242 |
| 6,960,366 B2 | 11/2005 | Ritter et al. | | |
| 6,972,942 B2 | 12/2005 | Ritter et al. | | |
| 6,982,863 B2 | 1/2006 | Galvagni et al. | | |
| 7,067,172 B2 | 6/2006 | Ritter et al. | | |
| 7,152,291 B2 | 12/2006 | Ritter et al. | | |
| 7,154,374 B2 | 12/2006 | Ritter et al. | | |
| 7,161,794 B2 | 1/2007 | Galvagni et al. | | |
| 7,177,137 B2 | 2/2007 | Ritter et al. | | |
| 7,344,981 B2 | 3/2008 | Ritter et al. | | |
| 7,345,868 B2 | 3/2008 | Trinh | | |
| 7,463,474 B2 | 12/2008 | Ritter et al. | | |
| 2005/0046536 A1 | 3/2005 | Ritter et al. | | |
| 2007/0014075 A1 | 1/2007 | Ritter et al. | | |
| 2007/0166554 A1 * | 7/2007 | Ruchert et al. | | 428/446 |
| 2007/0242416 A1 * | 10/2007 | Saito et al. | | 361/321.1 |
| 2008/0123248 A1 | 5/2008 | Kunishi et al. | | |
| 2008/0123249 A1 | 5/2008 | Kunishi et al. | | |
| 2008/0151470 A1 * | 6/2008 | Motoki et al. | | 361/303 |
| 2008/0158774 A1 | 7/2008 | Trinh | | |
| 2008/0210564 A1 | 9/2008 | Motoki et al. | | |

OTHER PUBLICATIONS

Motoki et al.; "Multilayer Ceramic Electronic Component and Method for Manufacturing the Same"; U.S. Appl. No. 12/356,648, filed Jan. 21, 2009.

Iwanaga et al.; "Monolithic Ceramic Electronic Component and Method for Manufacturing the Same"; U.S. Appl. No. 12/405,370, filed Mar. 17, 2009.

Iwanaga et al.; "Multilayer Ceramic Electronic Component and Method for Producing Same"; U.S. Appl. No. 12/405,372, filed Mar. 17, 2009.

Kayatani et al.; "Multilayer Ceramic Electronic Component and Method for Making the Same"; U.S. Appl. No. 12/469,799, filed May 21, 2009.

Takeuchi et al.; "Multilayer Ceramic Electronic Component and Manufacturing Method Thereof"; U.S. Appl. No. 12/340,570, filed Dec. 19, 2008.

Kobayashi et al.; "Multilayer Ceramic Electronic Component and Method for Making the Same"; U.S. Appl. No. 12/490,471, filed Jun. 24, 2009.

Nishihara et al.; "Laminated Ceramic Electronic Component and Manufacturing Method Thereof"; U.S. Appl. No. 12/617,879, filed Nov. 13, 2009.

Takeuchi et al.; "Multilayer Electronic Component and Method for Manufacturing the Same"; U.S. Appl. No. 12/817,352, filed Jun. 17, 2010.

* cited by examiner

FIG. 3 (1)
SAMPLE 1
FIG. 3 (2)
SAMPLE 2
FIG. 3 (3)
SAMPLE 3
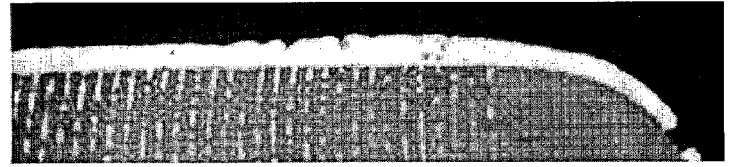
FIG. 3 (4)
SAMPLE 4
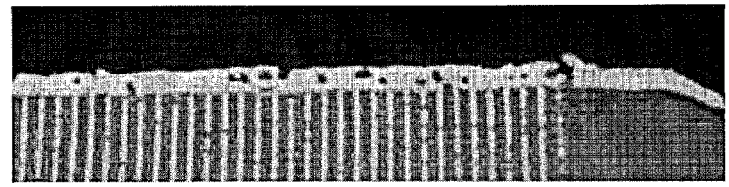
FIG. 3 (5)
SAMPLE 5
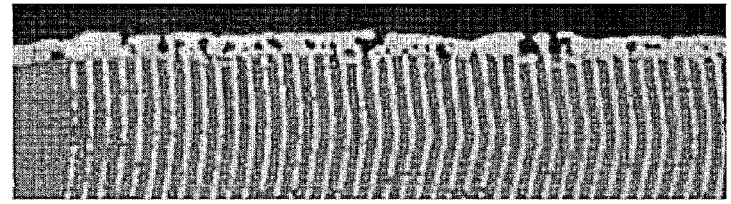

LAMINATED CERAMIC ELECTRONIC COMPONENT WITH DIRECTLY PLATED EXTERNAL TERMINAL ELECTRODES AND MANUFACTURING METHOD THEREFOR

BACKGROUND OF THE INVENTION

1. Field of the Invention

The present invention relates to a laminated ceramic electronic component and a method for manufacturing the laminated ceramic electronic component, and more particularly, to a laminated ceramic electronic component with external terminal electrodes formed directly by plating so as to be electrically connected to a plurality of internal electrodes, and a method for manufacturing the laminated ceramic electronic component.

2. Description of the Related Art

As shown in FIG. 4, a laminated ceramic electronic component 101 typified by a laminated ceramic capacitor generally includes a component main body 105 having a laminated structure, which includes a plurality of laminated ceramic layers 102 made of, for example, a dielectric ceramic, and a plurality of layered internal electrodes 103 and 104 arranged at interfaces between the adjacent ceramic layers 102. Respective ends of the plurality of internal electrodes 103 and respective ends of the plurality of internal electrodes 104 are exposed at opposed end surfaces 106 and 107 of the component main body 105, and external terminal electrodes 108 and 109 are respectively arranged so as to electrically connect the respective ends of the internal electrodes 103 to each other and the respective ends of the internal electrodes 104 to each other.

For the formation of the external terminal electrodes 108 and 109, typically a metal paste including a metal component and a glass component is applied onto the end surfaces 106 and 107 of the component main body 105, and then baked, thereby first forming paste electrode layers 110. Next, first plating layers 111 primarily including, for example, nickel are formed on the paste electrode layers 110, respectively, and second plating layers 112 primarily including, for example, tin or gold are further formed thereon. Thus, each of the external terminal electrodes 108 and 109 is formed in a three-layer structure including the paste electrode layer 110, the first plating layer 111, and the second plating layer 112.

The external terminal electrodes 108 and 109 are required to have excellent solderability when the laminated ceramic electronic component 101 is mounted on a substrate using solder. At the same time, the external terminal electrode 108 is required to electrically connect the plurality of internal electrodes 103 which are electrically insulated from each other to each other, and the external terminal electrode 109 is required to electrically connect the plurality of internal electrodes 104 which are electrically insulated from each other to each other. The second plating layers 112 described above ensures the solderability, whereas the paste electrode layers 110 electrically connect the internal electrodes 103 to each other and the internal electrodes 104 to each other. The first plating layers 111 prevent solder erosion in the solder joint.

However, the paste electrode layer 110 has a large thickness from several tens of μm to several hundreds of μm. Therefore, in order to limit the dimensions of the laminated ceramic electronic component 101 within certain specifications, there is undesirably a need to reduce the effective volume for ensuring a capacitance because there is a need to ensure the volumes of the paste electrode layers 110. On the other hand, the plating layers 111 and 112 have a thickness on the order of several μm. Thus, if the external terminal electrodes 108 and 109 can be defined only by the first plating layers 111 and the second plating layers 112, the effective volume for ensuring the capacitance can be increased.

For example, Japanese Unexamined Patent Publication No. 63-169014 discloses a method in which a conductive metal film is deposited by electroless plating on the entire sidewall surface of a component main body, at which internal electrodes are exposed, so as to short circuit the internal electrodes exposed at the sidewall surface.

However, the method for forming an external terminal electrode described in Japanese Unexamined Patent Publication No. 63-169014 involves no paste electrode layer formed by backing, and thus has a problem in that a plating solution and other moisture are likely to enter the component main body along the interfaces between the internal electrodes and ceramic layers. Therefore, when plating is applied directly to exposed ends of the internal electrodes, the plating solution may enter the component main body along the interfaces between the internal electrodes and the ceramic layers, and corrode the ceramic defining the ceramic layers and the internal electrodes, thereby causing structural defects. Furthermore, this also results defects in terms of reliability, such as degraded load characteristics against humidity for the laminated ceramic electronic component.

In particular, when tin or gold plating is to be applied, the problems described above are more likely to occur because tin and gold plating solutions usually contain a highly corrosive complexing agent.

To overcome the problems described above, International Publication No. WO2008/059666 discloses forming a plating layer defining an external terminal electrode directly on an end surface of a component main body, and then forming an interdiffusion layer at a boundary section between the internal electrodes and the plating layer by performing a heat treatment. In the interdiffusion layer, cubical expansion of metal occurs. Thus, gaps which may be present at the interfaces between the ceramic layers and each of the internal electrodes and external terminal electrode can be advantageously filled.

Furthermore, when the technique described in International Publication No. WO2008/059666 is used, the fixing strength at the interface between the ceramic defining the ceramic layers laminated with the internal electrodes interposed therebetween and the plating layer is also improved in the component main body. Thus, when the improvement of the fixing strength is required, it is preferable to perform a heat treatment at a temperature of 1000° C. or more, which is the eutectic temperature of metal defining the plating layer.

However, in the heat treatment at a temperature of 1000° C. or more as described above, when the temperature is linearly increased until it reaches the temperature, voids may occur due to a difference in diffusion velocity between the metal defining the plating layer and the metal defining the internal electrodes. In particular, such voids will occur in the metal having a higher diffusion velocity. For example, in the case of a combination of the internal electrodes primarily including nickel and the plating layer primarily including copper, voids will occur in the copper plating layer.

The occurrence of such voids not only decreases the adhesion strength between the external terminal electrode and the internal electrodes, but also decreases the reliability, such as load characteristics against humidity, of the laminated ceramic electronic component.

SUMMARY OF THE INVENTION

To overcome the problems described above, preferred embodiments of the present invention provide a method for manufacturing a laminated ceramic electronic component and a laminated ceramic electronic component manufactured by the manufacturing method.

A preferred embodiment of the present invention provides a method for manufacturing a laminated ceramic electronic component, the method including the steps of preparing a component main body having a laminated structure, the component main body including a plurality of internal electrodes formed therein, each of the internal electrodes primarily including nickel and being partially exposed, and forming an external terminal electrode on an external surface of the component main body, the external terminal electrode electrically connected to the internal electrodes, the step of forming the external terminal electrode including the step of forming a plating layer on exposed surfaces of the internal electrodes in the component main body, the plating layer primarily including copper, the method further including the step of applying a heat treatment at a temperature of about 800° C. or more to the component main body with the plating layer formed thereon. The step of applying the heat treatment preferably includes the step of maintaining a top temperature of about 1000° C. or more, and the step of maintaining a temperature of about 600° C. to about 900° C. at least once before the step of maintaining the top temperature.

Another preferred embodiment of the present invention provides a laminated ceramic electronic component including a component main body having a laminated structure, the component main body including a plurality of internal electrodes provided therein, the internal electrodes primarily including nickel, and each of the internal electrodes being partially exposed, and an external terminal electrode provided on an external surface of the component main body, the external terminal electrode electrically connected to the internal electrodes, in which the external terminal electrode includes a plating layer provided on exposed surfaces of the internal electrodes in the component main body, the plating layer primarily including copper. In the laminated ceramic electronic component according to this preferred embodiment of the present invention, a void ratio, which is a ratio of voids per unit area of a cross section of the plating layer, is less than about 1%.

In the step of applying the heat treatment to the component main body with the plating layer formed thereon, the step of maintaining at least once a temperature less than the top temperature is preferably performed before the step of maintaining the top temperature. Thus, for the following reason, voids are prevented near the interfaces between the plating layer and the internal electrodes, and adhesion strength and resistance to moisture between the external terminal electrode including the plating layer and the internal electrodes is significantly improved.

The occurrence of voids is considered to be caused by a difference in diffusion velocity between dissimilar metals. Therefore, the inclusion of the step of maintaining a temperature less than the top temperature enables copper in the plating layer, which has a relatively high diffusion velocity, to be preliminarily diffused into the internal electrodes. Such diffusion into the internal electrodes will keep diffusion from bursting when performing the step of maintaining the top temperature.

Furthermore, according to preferred embodiments of the present invention, the internal electrodes primarily include relatively inexpensive nickel, and the plating layer primarily includes copper which provides favorable growing power in the plating process. In such a combination of nickel and copper, voids may occur in the plating layer because the diffusion velocity of the copper is greater than that of nickel.

According to preferred embodiments of the present invention, such voids which could occur to the plating layer are prevented Moreover, according to preferred embodiments of the present invention, in the heat treatment, the top temperature is set to about 1000° C. or more, whereas the temperature selected in the step of maintaining a temperature less than the top temperature before maintaining the top temperature is preferably set to about 600° C. to about 900° C., for example. Thus, the effects described above are maximized under the combination of nickel mainly contained in the internal electrodes and copper mainly contained in the plating layer.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 3(1) to 3(5) include diagrams showing photographs of sections of samples manufactured in an experimental example, taken using a metallurgical microscope.

DETAILED DESCRIPTION OF PREFERRED EMBODIMENTS

Figure 1:
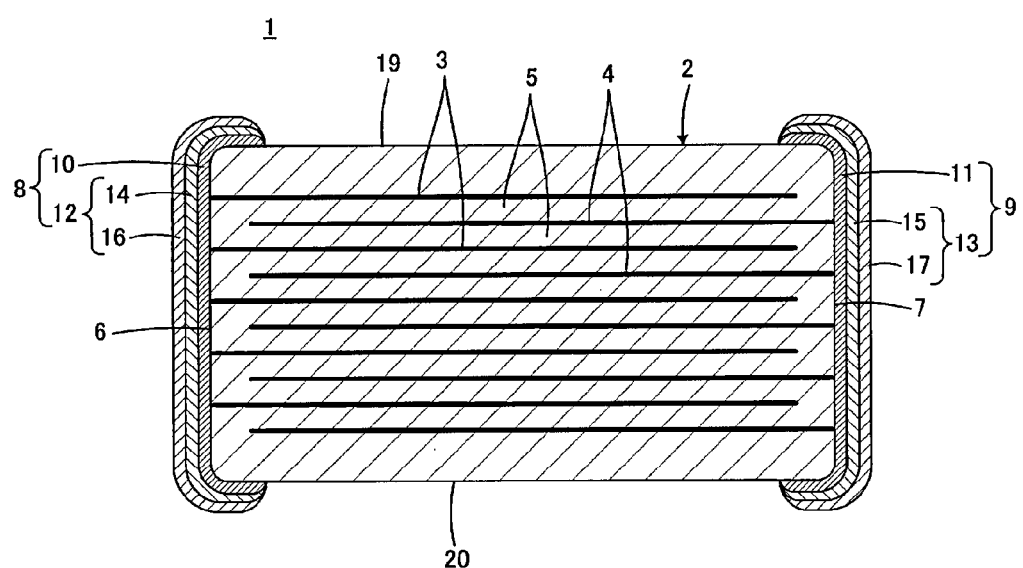
FIG. 1 is a cross-sectional view illustrating a laminated ceramic electronic component manufactured by a manufacturing method according to a preferred embodiment of the present invention.

A laminated ceramic electronic component 1 according to a preferred embodiment of the present invention and a manufacturing method therefor will be described with reference to FIGS. 1 and 2.

A laminated ceramic electronic component 1 includes a component main body 2 having a laminated structure. The component main body 2 includes a plurality of internal electrodes 3 and 4 therein. More specifically, the component main body 2 includes a plurality of laminated ceramic layers 5, and a plurality of layered internal electrodes 3 and 4 arranged at interfaces between the adjacent ceramic layers 5. The internal electrodes 3 and 4 preferably primarily include nickel, for example.

When the laminated ceramic electronic component 1 is a laminated ceramic capacitor, the ceramic layers 5 are preferably made of a dielectric ceramic. It is to be noted that the laminated ceramic electronic component 1 may define a different element such as an inductor, a thermistor, or a piezoelectric component. Therefore, depending on the function of the laminated ceramic electronic component 1, the ceramic layers 5 may be made of a dielectric ceramic, or alternatively, a magnetic ceramic, a semiconductor ceramic, or a piezoelectric ceramic, or, may be made of a material including a resin, for example.

Ends of the plurality of internal electrodes 3 and ends of the plurality of internal electrodes 4 are exposed respectively at opposed end surfaces 6 and 7 of the component main body 2, and external terminal electrodes 8 and 9 are arranged respectively so as to electrically connect the ends of the internal electrodes 3 to each other and the ends of the internal electrodes 4 to each other.

It is to be noted that, while the laminated ceramic electronic component 1 shown in FIG. 1 preferably is a two-terminal laminated ceramic electronic component provided with the two external terminal electrodes 8 and 9, preferred embodiments of the present invention can be applied to multi-terminal laminated ceramic electronic components.

The external terminal electrodes 8 and 9 respectively include first plating layers 10 and 11 formed directly by plating on the surfaces of the component main body 2 at which the internal electrodes 3 and 4 are exposed, that is, on the end surfaces 6 and 7, and second plating layers 12 and 13 respectively formed on the first plating layers 10 and 11.

The first plating layers 10 and 11 are provided to electrically connect the plurality of internal electrodes 3 to each other and the plurality of internal electrodes 4 to each other, and preferably primarily include copper, for example. The second plating layers 12 and 13 are provided to improve the laminated ceramic electronic component 1 in terms of mounting property or to provide the laminated ceramic electronic component 1 with a good mounting property, which preferably include solder barrier layers 14 and 15 made of, for example, a plating layer primarily including nickel, and solderability providing layers 16 and 17 made of, for example, a plating layer primarily including tin or gold and formed on the solder barrier layers 14 and 15 so as to provide solderability. It is to be noted that the plating primarily including tin described above also preferably includes, for example, Sn—Pb solder plating. In addition, the plating primarily including nickel also preferably includes Ni—P plating preferably formed by electroless plating.

As described above, the first plating layers 10 and 11 preferably primarily include copper with favorable growing power. Thus, the efficiency of the plating process can be improved, and the fixing strength of the external terminal electrodes 8 and 9 can be increased.

The plating method for forming the first plating layers 10 and 11 and the second plating layers 12 and 13 may preferably be electroless plating for depositing metal ions with use of a reducing agent, or electroplating through an electrifying process, for example.

Next, a method for manufacturing the laminated ceramic electronic component 1 shown in FIG. 1, in particular, a method for forming the external terminal electrodes 8 and 9 will be described.

First, the component main body 2 is manufactured by a well known method. Next, the external terminal electrodes 8 and 9 are formed on the end surfaces 6 and 7 of the component main body 2 so as to be electrically connected to the internal electrodes 3 and 4.

For the formation of the external terminal electrodes 8 and 9, first, the first plating layers 10 and 11 are formed on the end surfaces 6 and 7 of the component main body 2. In the component main body 2 before being plated, the plurality of internal electrodes 3 exposed at one end surface 6 are electrically insulated from each other, and the plurality of internal electrodes 4 exposed at the other end surface 7 are electrically insulated from each other. In order to form the first plating layers 10 and 11, metal ions in a plating solution are first deposited onto the sections of each of the exposed internal electrodes 3 and 4. Then, the plated depositions are further grown to physically connect the plated depositions on the respective sections of the adjacent exposed internal electrodes 3 and the plated depositions on the respective sections of the adjacent exposed internal electrodes 4. In this manner, uniform and dense first plating layers 10 and 11 are formed.

In this preferred embodiment, the component main body 2 of the laminated ceramic electronic component 1 preferably has a substantially rectangular parallelepiped shape, for example, and includes a pair of principal surfaces 19 and 20 opposed to each other and a pair of side surfaces opposed to each other (not shown in FIG. 1) in addition to the pair of end surfaces 6 and 7 described above. Further, the first plating layers 10 and 11 described above are formed respectively on the pair of end surface 6 and 7 such that the end edges of the first plating layers 10 and 11 are located on the pair of principal surfaces 19 and 20 and the pair of side surfaces, which are adjacent to the end surfaces 6 and 7.

As described above, in order to efficiently form the first plating layers 10 and 11 so that end edges of the first plating layers 10 and 11 extend to the pair of main surfaces 19 and 20 and the pair of side surfaces, dummy conductors, not shown, may preferably be formed on ends of the main surfaces 19 and 20 of the component main body 2, which are adjacent to the end surfaces 6 and 7, and/or in an outer layer section of the component main body 2. Such dummy conductors do not substantially contribute to development of electrical characteristics, but merely act to provide deposition of metal ions for the formation of the first plating layers 10 and 11 as well as to promote the plating growth.

In order to adequately expose the internal electrodes 3 and 4 at the end surfaces 6 and 7 before the plating step described above, it is preferable to perform polishing of the end surfaces 6 and 7 of the component main body 2. In this case, when polishing is performed to the extent that the respective exposed ends of the internal electrodes 3 and 4 project from the end surfaces 6 and 7, the respective exposed edges will be spread in a planar direction, thereby reducing the energy required for the plating growth.

Next, the component main body 2 with the first plating layers 10 and 11 formed thereon as described above is subjected to a heat treatment. As a heat treatment temperature, for example, a temperature of about 800° C. or more is preferably used. The state after this heat treatment is shown in FIG. 2. FIG. 2 shows the internal electrode 3 and the first plating layer 10. The structure on the side of the internal electrode 4 and the first plating layer 11 not shown in FIG. 2 is substantially the same as the structure on the side of the internal electrode 3 and the first plating layer 10 shown in FIG. 2, and description of the structure on the side of the internal electrode 4 and the first plating layer 11 will not be provided.

Figure 2:
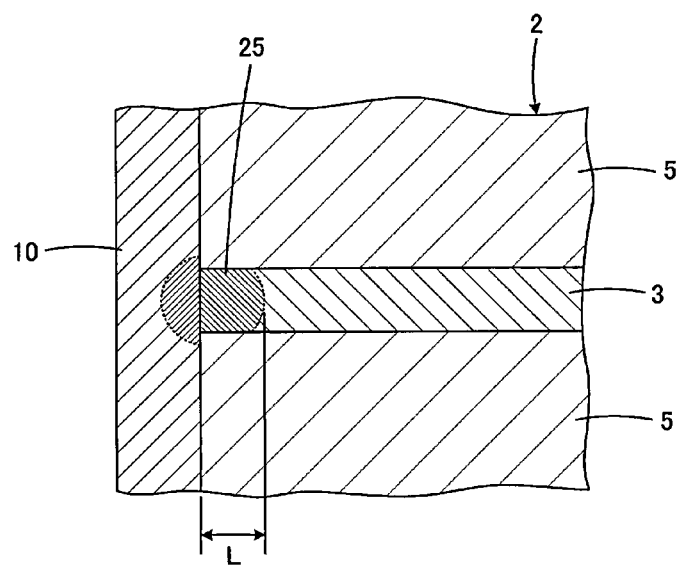
FIG. 2 is an enlarged cross-sectional view illustrating a section of a component main body provided with a first plating layer thereon and then subjected to a heat treatment for the purpose of forming an external terminal electrode, in the course of a manufacturing process of the laminated ceramic electronic component shown in FIG. 1.
Figure 4:
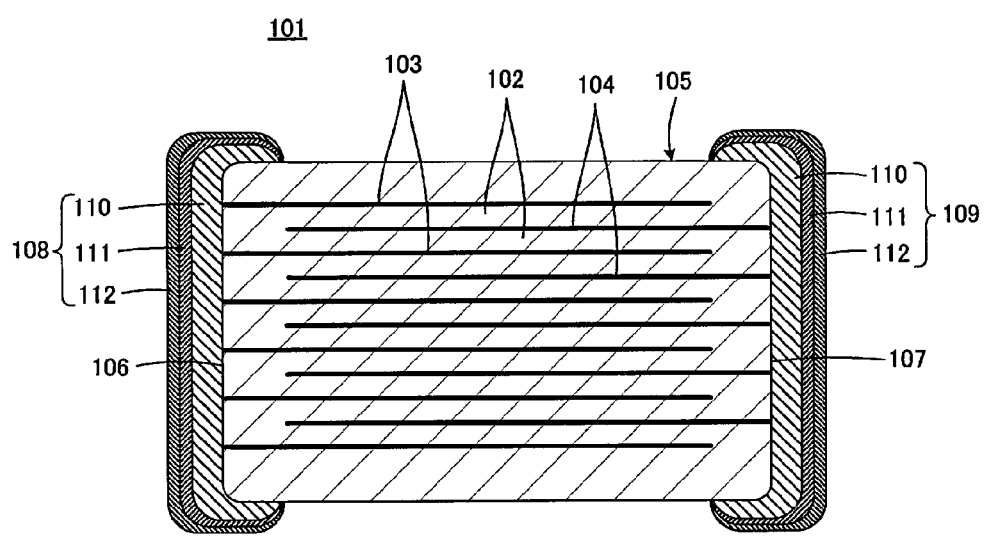
FIG. 4 is a cross-sectional view of a conventional laminated ceramic electronic component.

Referring to FIG. 2, an interdiffusion layer 25 is formed between the internal electrode 3 and the first plating layer 10. The interdiffusion layer 25 is preferably disposed in a region with a length L of about 2 µm or more, for example, from the boundary between the internal electrode 3 and the first plating layer 10. In other words, the heat treatment is preferably performed until the length L is about 2 µm or more, for example. In the interdiffusion layer 25, cubical expansion of metal occurs. Thus, gaps which may be present at the interfaces between the ceramic layers 5 and each of the internal electrode 3 and first plating layer 10 can preferably be filled, thereby preventing moisture from entering the inside of the component main body 2.

Furthermore, when the heat treatment described above is performed at a temperature of about 1000° C. or more, which is the eutectic temperature of the metal constituting the first plating layer 10, the fixing strength can also be improved at the interface between the ceramic defining the ceramic layers 5 laminated with the internal electrodes 3 interposed therebetween and the first plating layer 10 in the component main body 2. For this reason, the step of maintaining the top temperature of about 1000° C. or more is preferably performed in the heat treatment.

However, merely performing the step of maintaining the top temperature of about 1000° C. or more causes a difference in diffusion velocity between nickel primarily included in the internal electrode 3 and copper primarily included in the first plating layer 10, thereby readily resulting in the occurrence of voids in the first plating layer 10. Thus, in order to prevent such an occurrence of voids, the step of maintaining a temperature of about 600° C. to about 900° C., for example, which is less than the top temperature, is preferably performed before the step of maintaining the top temperature of about 1000° C. or more.

Using such heat treatment conditions enables copper primarily included in the first plating layer 10, which has a relatively high diffusion velocity, to be diffused in advance at relative low temperatures, into the internal electrode 3 primarily including nickel so as to increase the concentration of the copper in the internal electrode 3, and the difference between the diffusion velocity of the copper and the diffusion velocity of the nickel is reduced at relatively high temperatures. As a result, the occurrence of voids is effectively prevented, which is caused by the difference in diffusion velocity between nickel and copper. As is apparent from an experimental example described below, a void ratio which is the ratio of voids per unit area of a cross section of the first plating layer 10 is suppressed to less than about 1%. Therefore, the adhesion strength and resistance to moisture can be improved between the external terminal electrode 8 including the first plating layer 10 and the internal electrode 3.

Next, the second plating layers 12 and 13 are formed. The second plating layers 12 and 13 are formed after the formation of the first plating layers 10 and 11, and thus, are preferably easily formed by a conventional method, for example. This is because locations to be plated have a conductive and continuous surface at the stage at which the second plating layers 12 and 13 are formed.

In this preferred embodiment, in order to form the second plating layers 12 and 13, the step of forming the barrier layers 14 and 15 preferably made of, for example, nickel, and the step of forming the solderability providing layers 16 and 17 preferably made of, for example, tin or gold are sequentially performed.

It is to be noted that the heat treatment step described above may be performed after the formation of the second plating layers 12 and 13. Furthermore, in the heat treatment step, the step of maintaining a temperature of about 600° C. to about 900° C., for example, which is less than the top temperature, may be performed more than once at different temperatures different from each other.

An experimental example will be described below, which was used to determine the scope of the present invention and to confirm the advantageous effects of the present invention.

As a component main body of a laminated ceramic electronic component for use as a sample, a component main body for a laminated ceramic capacitor, with a length of about 1.9 mm, a width of about 1.05 mm, and a height about 1.05 mm, was prepared in which ceramic layers were made of a barium titanate based dielectric ceramic and internal electrodes primarily included Ni. In this component main body, the number of the laminated ceramic layers was 416, and each of the ceramic layers had a thickness of about 1.9 μm.

Next, 100 pieces of the component main bodies and 70 milliliters of media having a diameter of about 0.7 were input into a 300 milliliter horizontal rotating barrel. Then, the rotating barrel was immersed in a Cu plating bath with a pH adjusted to about 8.7 at a bath temperature of about 40° C., and a current was applied at a current density of about 0.5 A/dm$^2$ while rotating the horizontal rotating barrel at a barrel peripheral velocity of about 2.6 m/minute, thereby forming a Cu plating layer with a film thickness of about 5 μm directly on end surfaces of the component main bodies at which the internal electrodes were exposed. It is to be noted the Cu plating bath included copper pyrophosphate trihydrate at a copper concentration of about 5 g/liter, potassium pyrophosphate at about 180 g/liter, and potassium oxalate at about 10 g/liter.

Next, the component main bodies with the Cu plating layer formed thereon were subjected to a step of maintaining a temperature of less than a top temperature and a step of maintaining a top temperature under the conditions shown in Table 1. It is to be noted that the rate of temperature rise was about 100° C./minute in the temperature increasing process.

FIG. 3 shows photographs of sections of the laminated ceramic capacitors of the respective samples using a metallurgical microscope. In addition, Table 1 shows, as "void ratios", the ratios of voids per unit area, which was obtained by observations using the metallurgical microscope.

TABLE 1

| Sample No. | Middle Keeping Step | | | Top Temperature Keeping Step | | | Void Ratio [%] |
|---|---|---|---|---|---|---|---|
| | Temperature [° C.] | Oxygen Concentration [ppm] | Duration [minute] | Temperature [° C.] | Oxygen Concentration [ppm] | Duration [minute] | |
| 1 | 600 | 5 | 20 | 1065 | 100 | 1 | 0.3 |
| 2 | 700 | 5 | 20 | 1065 | 100 | 1 | 0 |
| 3 | 800 | 5 | 20 | 1065 | 100 | 1 | 0.3 |
| 4 | 900 | 5 | 20 | 1065 | 100 | 1 | 0.5 |
| 5 | — | — | — | 1065 | 100 | 1 | 20 |

As shown in FIGS. 3(1) to 3(5) and Table 1, as compared with the sample 5 obtained without performing the step of maintaining a temperature of less than a top temperature, the samples 1 to 4 subjected to the step of maintaining a temperature of less than a top temperature the void ratios were reduced to be less than about 1%.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing a laminated ceramic electronic component, the method comprising the steps of:
preparing a component main body having a laminated structure, the component main body including a plurality of internal electrodes formed therein, each of the internal electrodes primarily including nickel and being partially exposed from the component main body; and forming an external terminal electrode on an external surface of the component main body such that the external terminal electrode is electrically connected to the internal electrodes; wherein the step of forming the external terminal electrode includes the step of forming a plating layer on exposed surfaces of the internal electrodes, the plating layer primarily including copper;

the method further comprises the step of applying a heat treatment at a temperature of about 800° C. or more to the component main body with the plating layer formed thereon; and the step of applying the heat treatment includes the step of maintaining a top temperature of about 1000° C. or more, and the step of maintaining a temperature of about 600° C. to about 900° C. at least once before the step of maintaining the top temperature.

2. A laminated ceramic electronic component comprising:

a component main body having a laminated structure, the component main body including a plurality of internal electrodes provided therein, the internal electrodes primarily including nickel, and the internal electrodes each being partially exposed from the component main body; and an external terminal electrode arranged on an external surface of the component main body so as to be electrically connected to the internal electrodes; wherein the external terminal electrode includes a plating layer provided directly on exposed surfaces of the internal electrodes, the plating layer primarily including copper, and a void ratio defined by a ratio of voids per unit area of a cross section of the plating layer is less than about 1%.

* * * * *